United States Patent [19]

Lee

[11] Patent Number: 5,617,151
[45] Date of Patent: Apr. 1, 1997

[54] AUTOMATIC BROADCASTING CHANNEL SELECTION METHOD AND TELEVISION RECEIVER ADOPTING THE SAME

[75] Inventor: Taek-ho Lee, Seoul, Rep. of Korea

[73] Assignee: Samsung Electronics Co., Ltd., Kyungki-do, Rep. of Korea

[21] Appl. No.: 581,255

[22] Filed: Dec. 29, 1995

[30] Foreign Application Priority Data

Dec. 31, 1994 [KR]  Rep. of Korea ................. 94-40281

[51] Int. Cl.[6] .................................................. H04N 5/50
[52] U.S. Cl. ..................... 348/731; 348/726; 455/184.1; 455/186.1
[58] Field of Search ................................ 348/731, 732, 348/725, 726, 553, 554; 455/184.1, 186.1; H04N 5/50

[56] References Cited

U.S. PATENT DOCUMENTS

| | | | |
|---|---|---|---|
| 4,641,367 | 2/1987 | Van Deursen et al. | 455/161 |
| 4,881,273 | 11/1989 | Koyama et al. | 455/161 |
| 5,027,431 | 6/1991 | Tanaka et al. | 455/214 |
| 5,390,343 | 2/1995 | Rupprecht et al. | 455/161.3 |

*Primary Examiner*—Glenton B. Burgess
*Attorney, Agent, or Firm*—Sughrue, Mion, Zinn, Macpeak & Seas

[57] ABSTRACT

A television receiver which automatically selects broadcast channels on the basis of station identification codes transmitted with television signals. The receiver has: a tuner for performing tuning operations according to respective channel data, and for outputting a television signal of a broadcast channel; a demodulator for demodulating the television signal supplied from the tuner and outputting a resulting video signal, and generating an automatic gain control value for the supplied television signal; a detector for detecting the broadcasting station identification codes in the video signal; and a controller, for sequentially supplying channel data to the tuner, and receiving the automatic gain control value and the station identification codes, for controlling storage of channel data in the memory, station identification codes and automatic gain control values which respectively correspond to different broadcast channels, and for determining the channel data which has the lowest automatic gain control value among a plurality of channel data corresponding to the identical station identification codes stored in the memory, as the optimum channel data for the corresponding broadcasting station.

6 Claims, 2 Drawing Sheets

FIG. 3

| CHANNEL | RECEPTION CHANNEL DATA | BROADCASTING STATION IDENTIFICATION CODES | AGC VALUE |
|---|---|---|---|
| 1 | 0101010001101 0 | 1 D 1 0 1 | 15 |
| 2 | 0101010010010 1 | 1 D 1 0 5 | 30 |
| 3 | 0111101101100 0 | 1 D 1 0 7 | 25 |
| ~ | ~ | ~ | |
| 15 | 0110101100010 1 | 1 D 1 0 1 | 20 |
| 16 | 0110000101101 0 | 1 D 1 0 1 | 10 |
| 20 | 0011110001010 0 | 1 D 1 0 5 | 20 |

FIG. 4

| CHANNEL | RECEPTION CHANNEL DATA | BROADCASTING STATION IDENTIFICATION CODES | AGC VALUE |
|---|---|---|---|
| 1 | 0110000010101 0 | 1 D 1 0 1 | 15 |
| 2 | 0011110001010 1 | 1 D 1 0 5 | 30 |
| 3 | 0111101101100 0 | 1 D 1 0 7 | 25 |
| ... | ... | ... | ... |

5,617,151

AUTOMATIC BROADCASTING CHANNEL SELECTION METHOD AND TELEVISION RECEIVER ADOPTING THE SAME

BACKGROUND OF THE INVENTION

The present invention relates to a channel selection method for a television receiver and an apparatus therefor, and particularly to a method and apparatus for automatically selecting all broadcasting channels.

A conventional television (TV) set or a video cassette recorder (VCR) has an automatic channel selection function. The apparatus having an automatic channel selection function will be described below with reference to FIG. 1.

A controller 13 of FIG. 1 generates channel information to perform a fine tuning operation with respect to all TV broadcast bands. In order to automatically tune the lowest frequency of all the TV broadcast bands up to the highest frequency thereof, controller 13 sequentially generates channel information each of which has a frequency value increased by a predetermined interval starting from the lowest frequency value. Respective channel information is supplied to tuner 11 in the form of pulse-width-modulated data. Tuner 11 performs a frequency tuning operation according to a tuning voltage corresponding to the respective channel information supplied from controller 13, and outputs respective reception channel information representing a channel through which a TV broadcast signal is received to controller 13. Controller 13 controls storage of the reception channel information in a non-volatile memory 19. Such a signal processing is performed with respect to all the channel information which are sequentially generated by controller 13. Memory 19 sequentially stores the reception channel information with respect to the VHF channel having the lowest frequency up to the UHF channel having the highest frequency, according to input sequence. Tuner 11 converts a radio frequency (RF) signal received from an antenna into an intermediate frequency (IF) signal and outputs the IF signal to a demodulator 15. Demodulator 15 separates the input IF signal into audio and video signals and outputs the separated audio and video signals. An automatic gain controller (AGC) 16 in demodulator 15 provides a video signal of a constant level as the output of demodulator 15, although the level of the IF signal supplied from tuner 11 varies widely. The AGC value generated for such a gain control is fedback to tuner 11.

Since the broadcast channels are, however, usually differently received according to the local areas, the conventional automatic selection apparatus tends to select the broadcast channels of adjacent local areas. Accordingly, an identical broadcast program can be received via various channels. For this reason, when the selection is sequentially accomplished from the lower frequency to the higher frequency and the reception channel information resulting from the selection is also arranged in sequence, the channels other than a channel of which the reception state is the most excellent with respect to the same broadcast, should be manually deleted, which causes inconvenience to users.

SUMMARY OF THE INVENTION

Therefore, to solve the above problems, it is an object of the present invention to provide a method for automatically selecting a channel of which the reception sensitivity is the best among channels corresponding to an identical broadcasting station based on an automatic gain control value which is used for an automatic gain control of a received signal.

It is another object of the present invention to provide a television receiver which embodies the above method.

To accomplish the first object of the present invention, there is provided a method for automatically selecting broadcast channels within all television broadcast bands, on the basis of television signals to be transmitted with broadcasting station identification codes, at an area where numbers of broadcast channels corresponding to an identical broadcasting station are received, the method comprising the steps of:

(a) performing a tuning operation sequentially using each of a plurality of channel data which partition all television broadcast bands into a predetermined interval, and outputting a television signal of an individual broadcast channel to be received by the tuning operation;

(b) generating channel data, broadcasting station identification codes and automatic gain control values corresponding to the television signal of the individual broadcast channel output from the step (a);

(c) correspondingly storing the channel data, broadcasting station identification codes and automatic gain control value generated in the step (b), with regard to all broadcast channels in which the television signal is received;

(d) determining the lowest automatic gain control value among a plurality of automatic gain control values having identical broadcasting station identification codes, with respect to each of a plurality of broadcasting station identification codes stored in the step (c); and (e) determining channel data corresponding to the lowest automatic gain control value determined in the step (d), as the optimum channel data for the corresponding broadcasting station.

To accomplish the second object of the present invention, there is provided a television receiver for automatically selecting broadcast channels within all television broadcast bands, on the basis of television signals to be transmitted with broadcasting station identification codes, at an area where numbers of broadcast channels corresponding to an identical broadcasting station are received, the apparatus comprising:

a memory; a tuner for performing a tuning operation according to the applied respective channel data, and outputting a television signal of an individual broadcast channel to be received by the tuning operation; a demodulator for demodulating the television signal supplied from the tuner, outputting a video signal as a result of demodulation, and generating an automatic gain control value for the applied television signal; a detector, receiving the video signal from the demodulator, for detecting the broadcasting station identification codes in the supplied video signal; and a controller, sequentially supplying each of a plurality of channel data, which partition all television broadcast bands into a predetermined interval, to the tuner, and receiving the automatic gain control value and the broadcasting station identification codes, for controlling storage of a plurality of channel data, broadcasting station identification codes and automatic gain control values which respectively correspond to each of broadcast channels to receive the television signal output from the tuner, in the memory, and for determining channel data having the lowest automatic gain control value among a plurality of channel data corresponding to the identical broadcasting station identification codes stored in the memory, as the optimum channel data for the corresponding broadcasting station.

BRIEF DESCRIPTION OF THE DRAWINGS

The preferred embodiments are described with reference to the drawings wherein:

FIG. 3 is a view for explaining the preferred embodiment of the present invention, which shows reception channels corresponding to an identical broadcasting station.

FIG. 4 is a view explaining the preferred embodiment of the present invention which shows the channels having the best reception sensitivity in correspondence to the broadcasting stations.

DETAILED DESCRIPTION OF THE PREFERRED EMBODIMENT

A preferred embodiment of the present invention will be described below in more detail with reference to the accompanying drawings FIGS. 2 through 4.

Figure 1:
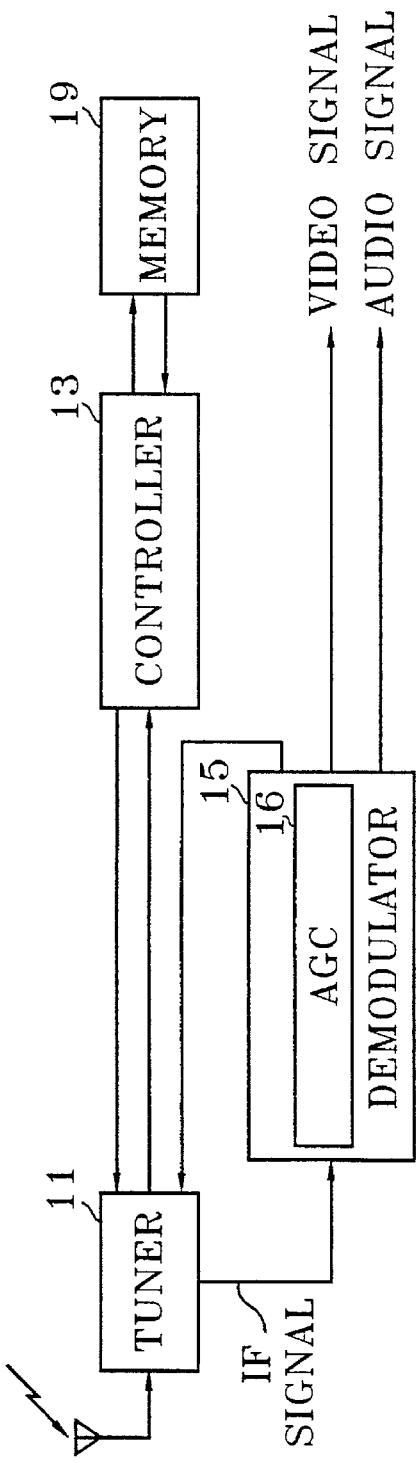
FIG. 1 is a block diagram of a conventional channel selection apparatus.
Figure 2:
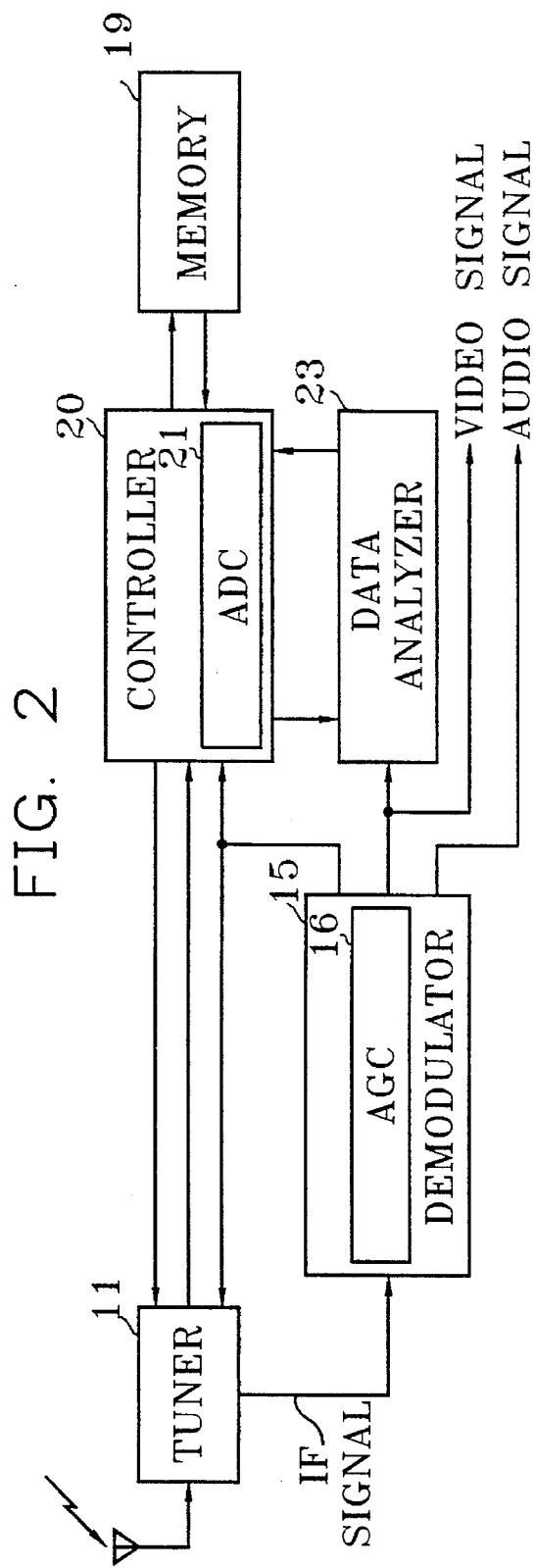
FIG. 2 is a block diagram of part of a television receiver having an automatic selection function according to a preferred embodiment of the present invention.

The apparatus of FIG. 2 includes tuner 11 and demodulator 15 which perform the same functions as those of the FIG. 1 apparatus. The AGC signal output from demodulator 15 is supplied to tuner 11 and controller 20. The video signal output from demodulator 15 is supplied to data analyzer 23. Data analyzer 23 and controller 20 are constructed to communicate data with each other. Controller 20 includes an analog-to-digital converter (ADC) 21 for digitizing the applied AGC signal.

The above-described FIG. 2 apparatus performs fine tuning with respect to all TV broadcast bands in the same manner as that of the FIG. apparatus. In more detail, controller 20 sequentially generates channel information each of which has a frequency value increaseed by a predetermined interval from the lowest frequency of all TV broadcast bands up to the highest frequency thereof. The channel information are supplied to tuner 11 in the form of the pulse-width-modulated data as described above. Tuner 11 performs a frequency tuning operation for each of the channel information, converts the receive RF signal into the IF signal and outputs the converted signal to demodulator 15. Tuner 11 generates reception channel information representing a channel through which a TV broadcast signal is received and outputs the generated reception channel information to controller 20. AGC 16 in demodulator 15 generates an AGC signal for automatic-gain-controlling the IF signal. The generated AGC signal is fedback to tuner 11 and is simultaneously input to ADC 21 in controller 20. ADC 21 in controller 20 digitally converts the AGC signal into a digital AGC value. Data analyzer 23 separates broadcasting station identification codes contained in a blanking interval of a video signal applied from demodulator 15 to store the separated result in an incorporated register, and transmits the stored broadcasting station identification codes to controller 20 under the command of controller 20. Controller 20 controls storing of the broadcasting station identification codes and the AGC values respectively corresponding to the respective reception channel information and the reception channel information in memory 19. The memory 19 is a non-volatile memory. One example of the broadcasting station identification codes and the AGC values corresponding to the reception channel information is shown in FIG. 3.

In Europe, the codes are actually assigned to each country and broadcasting station. Taking an example "1D101" among the broadcasting station identification codes shown in FIG. 3, a first portion "1D" is a country code, the next "1" is a regional code and the last "01" is a broadcasting station code. The broadcasting station code "01" designates the ARD broadcasting station, and "05" designates the N3 broadcasting station and "07" designates the NOR broadcasting station.

If the data shown in FIG. 3 is completely stored in memory 19, controller 20 compares the AGC values of the channels having the broadcasting station identification code "1D101" with each other, in order to rearrange the data in sequence of the predetermined broadcasting station priority, that is, "1D101," "1D102," "1D103," . . . Hereafter, a user channel is defined as a channel rearranged on the basis of the predetermined broadcasting station priority. In FIG. 3, the channels of broadcasting station identification code "1D101" are 1, 15 and 16. Controller 20 reads the AGC values of the channels from memory 19 and compares the AGC values, and finally determines channel "16" having the smallest AGC value as the reception channel. This determination is based on the fact that the channel having the smallest AGC value provides the best quality of picture since the AGC value is inversely proportional to the field strength. Controller 20 cancels the reception channel information, the broadcasting station identification codes and the AGC values in connection with the channels "1" and "15" from memory 19, and determines the channel "16" having the smallest AGC value as a user channel number "1." The reception channel information of the determined channel "16" is stored in memory 19 together with the user channel number "1." When such a signal processing is performed with respect to channels "2" and "20" having broadcasting station identification code "1D105" shown in FIG. 3, controller 20 controls storing of the reception channel data corresponding to channel "20" in memory 19 in the form corresponding to the user channel number "2." Controller 20 performs such an operation with respect to all broadcasting station identification codes, determines a channel having the lowest AGC value corresponding to each broadcasting station identification code, and controls the storing of the determined user channel number and the reception channel information corresponding to the user channel.

The data of the user channel is finally determined by repetitively performing such an operation and is shown in FIG. 4. The AGC values among the data shown in FIG. 4 can be stored in memory 19 as necessary.

Thus, the present invention automatically selects a channel of which the reception sensitivity is best among various reception channels corresponding to an identical broadcasting station based on the comparison of magnitudes of the AGC values in connection with the automatic gain control of the received channel, to eliminate inconvenience to the user caused by having delete the stored unnecessary channels due to the automatic channel selection. As well, since the reception channels of which the reception sensitivities are best are rearranged in the predetermined priority sequence, the user can rearrange the optimum reception channels according to his or her desired priority sequence by altering such a priority sequence only.

While only certain embodiments of the invention have been specifically described herein, it will apparent that numerous modifications may be made thereto without departing from the spirit and scope of the invention.

What is claimed is:

1. A television receiver for automatically selecting broadcast channels within all television broadcast bands, on the basis of television signals to be transmitted with broadcasting station identification codes, at an area where a plurality of broadcast channels corresponding to an identical broadcasting station are received, the television receiver comprising;

a memory;

tuning means for performing a tuning operation according to applied respective channel data, and outputting a television signal of an individual broadcast channel which is received by the tuning operation;

demodulation means for demodulating the television signal supplied from said tuning means, outputting a video signal as a result of demodulation, and generating an automatic gain control value for said supplied television signal;

detection means, receiving the video signal from said demodulation means, for detecting the broadcasting station identification codes in the video signal; and control means, sequentially supplying each of a plurality of channel data, which partition all television broadcast bands into a predetermined interval, to said tuning means, and receiving said automatic gain control value and said broadcasting station identification codes, for controlling storage of the plurality of channel data, the broadcasting station identification codes and the automatic gain control value which respectively correspond to each of broadcast channels to receive the television signal output from said tuning means, in said memory, and for determining channel data having the lowest automatic gain control value among a plurality of channel data corresponding to identical broadcasting station identification codes stored in said memory, as the optimum channel data for a corresponding broadcasting station.

2. The receiver as claimed in claim 1, wherein said control means controls to reassign, in a predetermined order, a plurality of the optimum channel data for a plurality of broadcasting stations and to store the reassigned data in said memory.

3. The receiver as claimed in claim 1, wherein said control means controls to finally store in said memory a plurality of the determined optimum channel data and corresponding ones of the individual broadcasting station identification codes.

4. A method for automatically selecting broadcast channels within all television broadcast bands, on the basis of television signals to be transmitted with broadcasting station identification codes, at an area where numbers of broadcast channels corresponding to an identical broadcasting station are received, the method comprising the steps of:

(a) performing a tuning operation sequentially using each of a plurality of channel data which partition all television broadcast bands into a predetermined interval, and outputting a television signal of an individual broadcast channel which is received by the tuning operation;

(b) generating channel data, said broadcasting station identification codes and an automatic gain control value corresponding to the television signal of the individual broadcast channel output in said step (a);

(c) correspondingly storing the channel data, the broadcasting station identification codes and the automatic gain control value generated in said step (b), with regard to all broadcast channels in which the television signal is received;

(d) determining the lowest automatic gain control value among a plurality of automatic gain control values having identical broadcasting station identification codes, with respect to each of a plurality of broadcasting station identification codes stored in said step (c); and (e) determining channel data corresponding to the lowest automatic gain control value determined in said step (d), as optimum channel data for the corresponding broadcasting station.

5. The method as claimed in claim 4, wherein said step (b) comprises the steps of (b1) demodulating the television signal of the individual broadcast channel and outputting the video signal as a result of demodulation; and (b2) detecting the broadcasting station identification codes in the video signal output by said step (b1).

6. The method as claimed in claim 4, further comprising the step of rearranging a plurality of the optimum channel data determined by said step (e) in a predetermined order.

* * * * *